United States Patent
Lu et al.

(10) Patent No.: US 7,432,127 B2
(45) Date of Patent: Oct. 7, 2008

(54) CHIP PACKAGE AND PACKAGE PROCESS THEREOF

(75) Inventors: Yung-Li Lu, Kaohsiung Hsien (TW); Gwo-Liang Weng, Kaohsiung (TW); Ying-Tsai Yeh, Kaohsiung Hsien (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 109 days.

(21) Appl. No.: 11/464,296

(22) Filed: Aug. 14, 2006

(65) Prior Publication Data

US 2007/0042534 A1    Feb. 22, 2007

(30) Foreign Application Priority Data

Aug. 18, 2005   (TW) .............................. 94128157 A

(51) Int. Cl.
*H01L 21/00*    (2006.01)
*H01L 23/48*    (2006.01)
*H01L 23/52*    (2006.01)
*H01L 29/40*    (2006.01)

(52) U.S. Cl. ...................... 438/106; 257/777

(58) Field of Classification Search .............. 438/1, 438/109, 724, 777, 123, 107
See application file for complete search history.

(56) References Cited

U.S. PATENT DOCUMENTS 6,353,263 B1 *  3/2002  Dotta et al. ................. 257/777
6,716,667 B2 *  4/2004  Yamaguchi ................. 438/106

FOREIGN PATENT DOCUMENTS

JP              10144722 A    *    5/1998

* cited by examiner

*Primary Examiner*—Ha Nguyen
*Assistant Examiner*—Valerie Brown
(74) *Attorney, Agent, or Firm*—Thomas, Kayden, Horstemeyer & Risley

(57) ABSTRACT

A chip package and a package process thereof are provided. The chip package comprises a package substrate, a chip, a plurality of spacers, an adhesive layer, and a plurality of wires. The package substrate has a carrying surface. The chip is disposed on the carrying surface. The spacers are formed between the chip and the carrying surface to maintain an interval between the chip and the package substrate. The adhesive layer is disposed between the chip and carrying surface to encapsulate the spacers. The chip is electrically connected to the package substrate via the wires.

3 Claims, 6 Drawing Sheets

CHIP PACKAGE AND PACKAGE PROCESS THEREOF

RELATED APPLICATIONS

The present application is based on, and claims priority from, Taiwan Application Serial Number 94128157, filed Aug. 18, 2005, the disclosure of which is hereby incorporated by reference herein in its entirety.

FIELD OF THE INVENTION

The present invention relates to a semiconductor device and a process thereof, and more particularly, to a chip package and a package process thereof.

BACKGROUND OF THE INVENTION

In semiconductor industries, the production of integrated circuits (ICs) mainly includes three steps: the manufacture of a wafer, the manufacturing of the integrated circuits and the package of the integrated circuits. A bare chip is formed after the steps including wafer manufacture, circuit design, mask manufacture and wafer dicing are performed. Each bare chip formed from dicing the wafer is electrically connected to an external signal through connecting points on each bare chip, and then the bare chip is encapsulated by a molding material. The purpose of the package is to prevent the bare chip from being damaged by humidity, heat and noise signals, and to provide the bare chip with an electrically connecting medium for electrically connecting the chip to an external circuit. As a result, the package step of the integrated circuit is completed.

Refer to FIG. 1. FIG. 1 illustrates a cross-sectional view of a conventional chip package. The conventional chip package 100 comprises a package substrate 110, a chip 120, a silver epoxy 130, a plurality of wires 140 and molding glue 150. The chip 120 is deposed on a carrying surface 112 of the package substrate 110. The silver epoxy 130 is disposed between the chip 120 and the carrying surface 112 to adhere the chip 120 onto the carrying surface 112 of the package substrate 110. It is known from the illustration in FIG. 1 that the chip 120 and the package substrate 110 are electrically connected to each other by the wires 140, i.e. the chip 120 and the package substrate 110 are connected by wire bonding. The wires 150 are encapsulated and protected by the molding glue 150, wherein a portion of surfaces of the chip 120 is exposed by the molding glue 150.

However, in the wire bonding process of the conventional chip package 100, because the material of the silver epoxy 130 is softer, the spillage of the silver epoxy 130 occurs (i.e. the silver epoxy 130 oozes from the periphery of the chip 120) from the pressure resulting in the wire bonding process, thereby causing poor connections between the chip 120 and the package substrate 110. Besides, during the process when the chip 120 is deposed onto the package substrate 110, the chip 120 is easily tilted because the thickness of the silver epoxy 130 is difficult to control. As a result, the yield of the chip package process is lowered, and the reliability of the chip package cannot be effectively enhanced.

SUMMARY OF THE INVENTION

One aspect of the present invention is to provide a chip package, which can enhance the connection efficiency between a chip and a package substrate and have superior reliability.

Another aspect of the present invention is to provide a chip package process that prevents poor connections that may result during the connecting process of a chip and a package substrate, and thereby can provide a good process yield.

According to the aforementioned aspects, the present invention provides a chip package, comprising a package substrate, a chip, a plurality of spacers, an adhesive layer and a plurality of wires. The package substrate has a carrying surface, and the chip is disposed on the carrying surface. The spacers are formed between the chip and the carrying surface to maintain an interval between the chip and the package substrate. The adhesive layer is disposed between the chip and the carrying surface to encapsulate the spacers, and the wires electrically connect the chip and the package substrate.

According to a preferred embodiment of the present invention, the spacers are in the shape of a lump, for example.

According to a preferred embodiment of the present invention, the spacers are in the shape of bar. The bar spacers comprise at least one frame, for example.

According to a preferred embodiment of the present invention, the carrying surface includes, for example, a plurality of indentations, and the spacers are correspondingly deposed in the indentations. The spacers comprise a plurality of metal balls, for example. For example, the chip package further comprises a plurality of metal layers respectively deposed in the indentations for connecting the metal balls and the package substrate.

According to a preferred embodiment of the present invention, the chip package further comprises a molding glue to encapsulate the wires and at least cover a portion of the package substrate and a portion of the chip.

According to a preferred embodiment of the present invention, a material of the spacers is metal or green print, for example.

According to the aforementioned aspects, the present invention provides a chip package process comprising the following steps. Firstly, a package substrate is provided, wherein the package substrate has a carrying surface. Next, a plurality of spacers are formed on the carrying surface. Then, a chip is connected onto the carrying surface of the package substrate by wire bonding, and the spacers are deposed between the chip and the carrying surface.

According to a preferred embodiment of the present invention, a method for forming the spacers includes a printing method, or a photolithography and/or etching process, for example.

According to a preferred embodiment of the present invention, after the wire bonding the chip and the package substrate, the chip package process further comprises forming molding glue on the package substrate, wherein the molding glue encapsulates the wires and at least covers a portion of the package substrate and a portion of the chip.

According to a preferred embodiment of the present invention, before forming the spacers on the carrying surface, the chip package process further comprises forming a plurality of indentations in the carrying surface, for example, to make the spacers formed subsequently depose in the indentations. A method for forming the spacers comprises deposing a metal ball into each indentation, for example. In addition, before deposing the metal balls, the chip package process further comprises forming a metal layer in each indentation, for example.

According to the aforementioned description, an interval between the package substrate and the chip in the chip package of the present invention is maintained by spacers, so that the spill of the adhesive layer during the chip package process can be effectively improved to prevent the adhesive layer from oozing from the periphery of the chip for enhancing the connection intensity of the chip and the package substrate. Furthermore, when the chip is deposed onto the package substrate, the chip can be deposed on the carrying surface stably with the support of the spacers.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

First Embodiment

Figure 1:
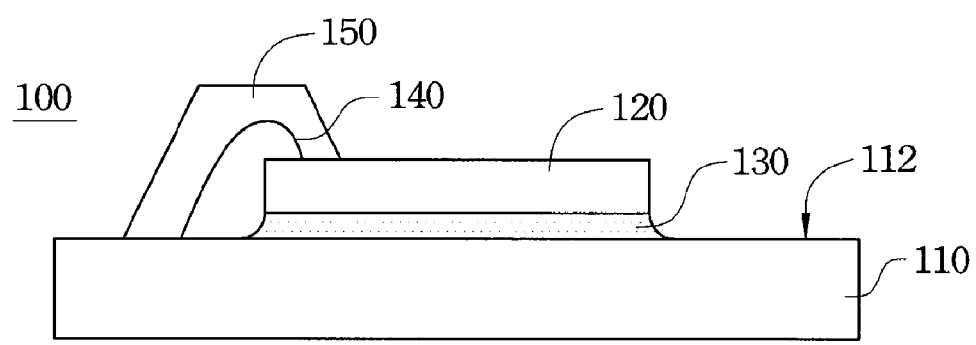
FIG. 1 illustrates a cross-sectional view of a conventional chip package.
Figure 2:
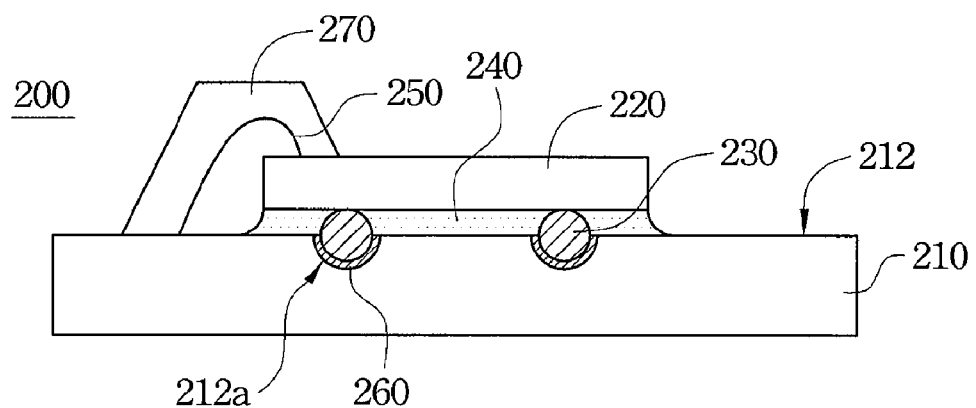
FIG. 2 illustrates a cross-sectional view of a chip package in accordance with a first preferred embodiment of the present invention.

Refer to FIG. 2. FIG. 2 illustrates a cross-sectional view of a chip package in accordance with a first preferred embodiment of the present invention. A chip package 200 of the present embodiment comprises a package substrate 210, a chip 220, a plurality of spacers 230, an adhesive layer 240 and a plurality of wires 250. The package substrate 210 has a carrying surface 212, and the chip 220 is deposed on the carrying surface 212. The spacers 230 are formed between the chip 220 and the carrying surface 212 to maintain an interval between the chip 220 and the package substrate 210. The adhesive layer 240 is deposed between the chip 220 and the carrying surface 212 to encapsulate the spacers 230. In the embodiment, the chip 220 is electrically connected to the package substrate 210 through the wires 250 by, for example, wire bonding, and a material of the adhesive layer 240 is epoxy resin for example.

Referring to FIG. 2 again, the carrying surface 212 of the package substrate 210 of the embodiment includes a plurality of indentations 212a for example, and the spacers 230 are correspondingly deposed in the indentations 212a. In the embodiment, the spacers 230 are metal balls, for example. In addition, the chip package 200 of the embodiment further comprises a plurality of metal layers 260 respectively deposed in the indentations 212a for connecting the spacers 230 and the package substrate 210. For example, the metal layers 260 are formed by electroplating, and the metal layers 260 are mainly used to enhance the connection effect between the spacers 230 and the package substrate 210. Because there are spacers deposed between the chip 220 and the carrying surface 212 of the package substrate 210 in the embodiment, when the chip 220 is deposed onto the carrying surface 212 of the package substrate 210 and a wire bonding process is performed, an interval between the chip 220 and the package substrate 210 can be maintained by spacers 230 to control the thickness of the adhesive layer 240 and to prevent the chip 220 from being tilted during wire bonding.

Figure 3:
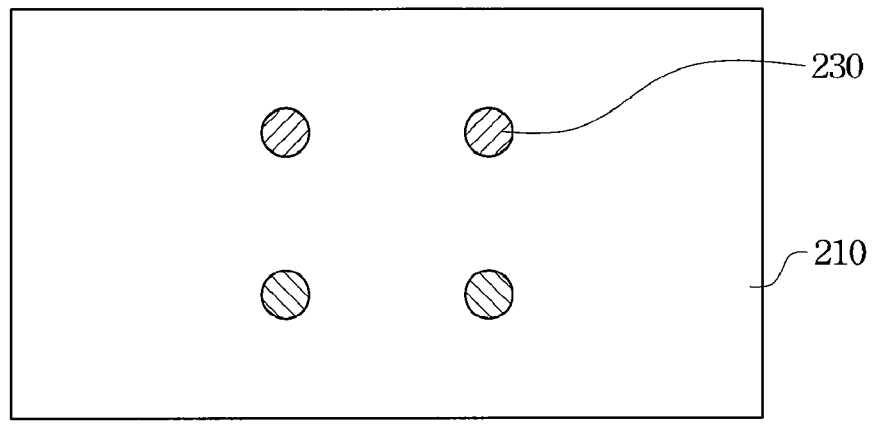
FIG. 3 illustrates a top view of a portion of the chip package illustrated in FIG. 2.

It is noteworthy that the locations of the spacers 230 may be designed in many different forms, and examples will be given for illustration in the following description. Refer to FIG. 3. FIG. 3 illustrates a top view of a portion of the chip package illustrated in FIG. 2. For clarity, the diagram illustrated in FIG. 3 only shows the spacers 230 and the package substrate 210. As shown in FIG. 3, the indentations 212a are respectively formed on four corners of the connection surface of the package substrate 210 connected with the chip 220, and the spacers 230 are respectively deposed in the indentations 212a at the four corners, for example. In other embodiments of the present invention, for example, the spacers 230 can be arranged in a matrix on the connection surface of the package substrate 210 connected with the chip 220, or can be arranged along the rim of the connection surface, or can be deposed in other appropriate arrangements; thereupon, the details will not be given in the following.

Further referring to FIG. 2, in the embodiment, the spacers 230 are metal balls, and the indentations 212a are in a shape of a bowl corresponding to the shape of the metal balls, for example. However, in other embodiments, the spacers 230 may be in the shape of a lump, bar shape or other shape, and the indentations 212a are trenches or holes in various shapes corresponding to the shape of the spacers 230. The foregoing embodiments are illustrations of the present invention rather than limiting to the present invention.

The chip package 200 of the embodiment further comprises molding glue 270, wherein the molding glue 270 is deposed on a portion of the chip 220 and a portion of the package substrate 210 to encapsulate the wires 250 for preventing the wires 250 from being degraded by external factors, such as humidity. In the present embodiment, the chip 220 is an optical sensing chip, for example, and the molding glue 270 exposes a portion of the surface of the chip 220 for heat dissipating of the chip 220 and making the chip 220 easily receive external light. Certainly, in other applications, the molding glue 270 may fully encapsulate the chip 220 and the wires 250 for better protection.

The following description will illustrate a process of the chip package using the aforementioned metal balls as the spacers. Refer to FIG. 4A through FIG. 4F, FIG. 4A through FIG. 4F are schematic flow diagrams showing the package process of the chip package illustrated in FIG. 2.

Figure 4A:
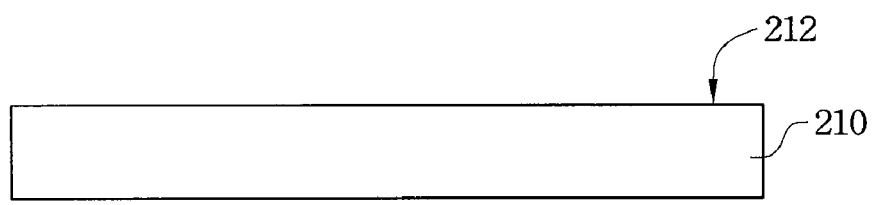
FIGS. 4A through 4F are schematic flow diagrams showing the package process of the chip package illustrated in FIG. 2.

As shown in FIG. 4A, a package substrate 210 with a carrying surface 212 is initially provided, wherein the package substrate 210 is a multi-layered circuit board, for example.

Figure 4B:
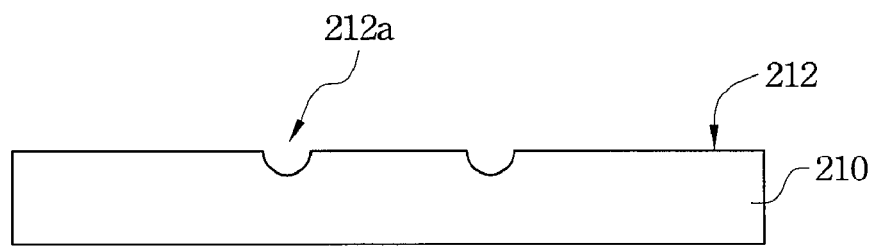

As shown in FIG. 4B, before a plurality of spacers 230 (metal balls) are formed on the carrying surface 212, a plurality of indentations 212a are formed in the carrying surface 212 by, for example, etching or drilling.

Figure 4C:
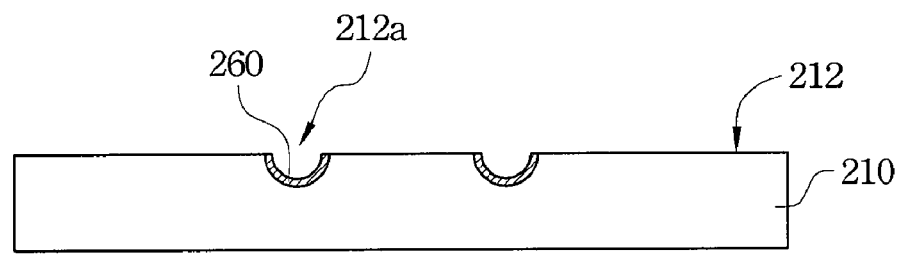

As shown in FIG. 4C, the present embodiment can selectively form metal layers 260 respectively in the indentations 212a by electroplating for enhancing the connection effect of the package substrate 210 and the spacers 230 (metal balls) formed subsequently.

Figure 4D:
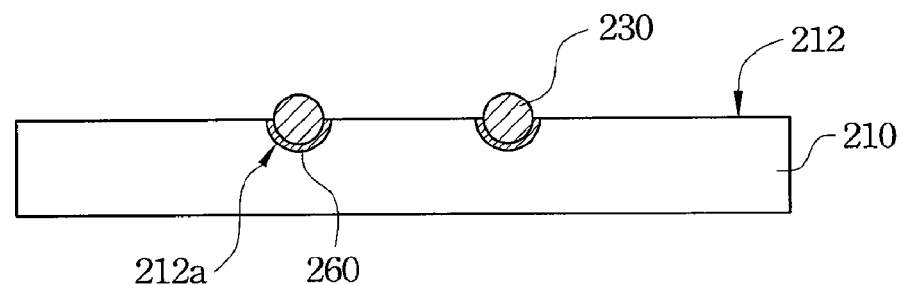

Next, as shown in FIG. 4D, the spacers 230 are formed on the carrying surface 212 of the package substrate 210. Because the spacers 230 of the embodiment are metal balls, the step of forming the spacers 230 may be performed by vacuum transferring or gravity transferring to respectively depose one metal ball into each indentation 212a.

Figure 4E:
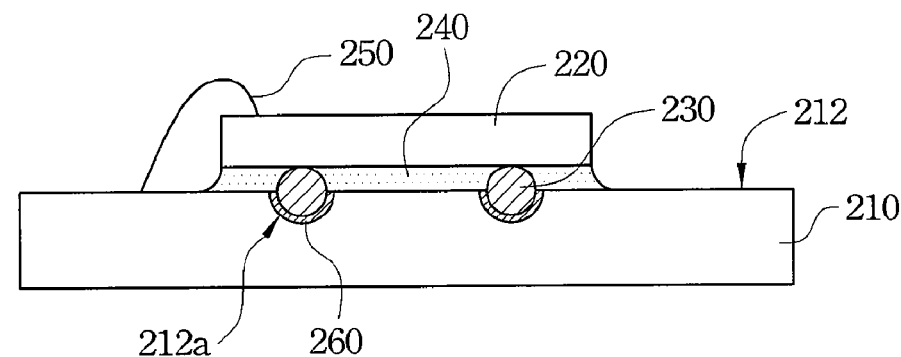

Then, as shown in FIG. 4E, the chip 220 is connected onto the carrying surface 212 of the package substrate 210 by wire bonding, wherein the chip 220 is connected to the package substrate 210 by an adhesive layer 240, the chip 220 is electrically connected to the package substrate 210 by the wires 250, and the spacers 230 are between the chip 220 and the package substrate 210.

Figure 4F:
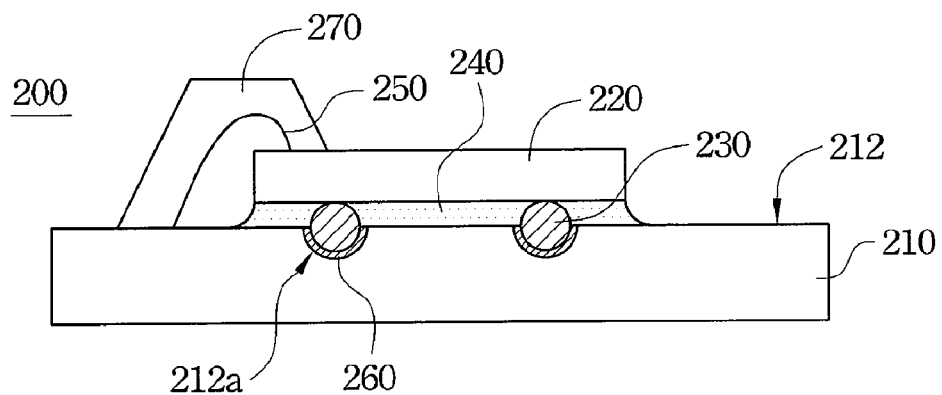

Subsequently, as shown in FIG. 4F, a molding process is performed to form molding glue 270 on the package substrate 210, wherein the molding glue 270 encapsulates the wires 250 and exposes a portion of the chip 220, so as to form the chip package 200.

Second Embodiment

Figure 5:
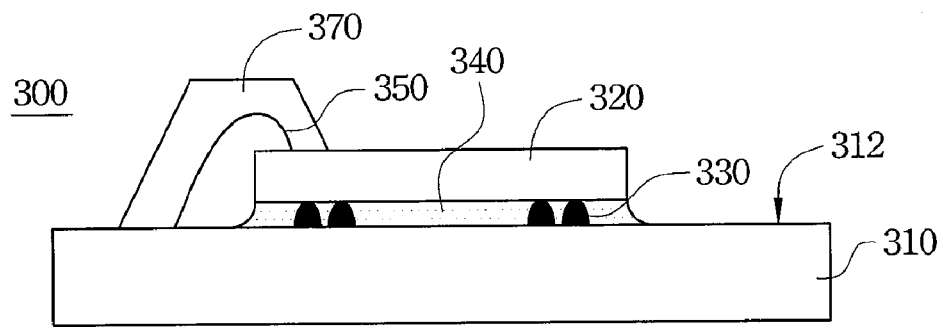
FIG. 5 illustrates a cross-sectional view of a chip package in accordance with a second preferred embodiment of the present invention.

Refer to FIG. 5. FIG. 5 illustrates a cross-sectional view of a chip package in accordance with a second preferred embodiment of the present invention. The differentiation between the second embodiment and the first embodiment is a carrying surface 312 of a package substrate 310 in the second embodiment does not include the indentations 212a and the metal layers 260 in the indentations 212a (as shown in FIG. 2), and the spacers 330 are not metal balls but protuberances on the carrying surface 312, and a material of the spacers 330 is green print, for example.

In regard to shape, the spacers 330 are in a shape of lump or bar, for example. When the spacers 330 are in the shape of a lump, the arrangement of the spacers 330 can have various modifications such as recited in the first embodiment, and the details are not given thereupon.

Figure 6:
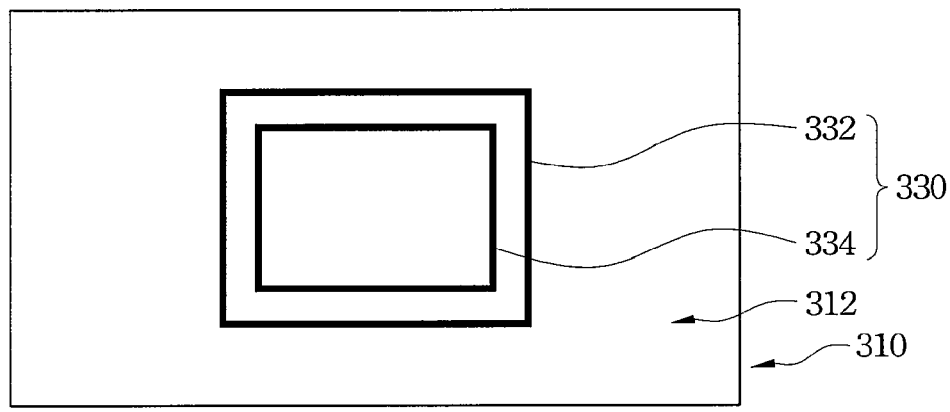
FIG. 6 illustrates a top view of a portion of the chip package illustrated in FIG. 5.

Refer to FIG. 6. FIG. 6 illustrates a top view of a portion of the chip package illustrated in FIG. 5, wherein the diagram illustrated in FIG. 6 only shows the spacers 330 and the package substrate 310 for clarity, when the spacers 330 are in the shape of a bar. The spacers 330 comprise at least one frame, such as a first frame 332 and a second frame 334 deposed within the first frame 332 shown in FIG. 6, on the carrying surface 312 of the package substrate 310, for example. The pattern of the spacers 330 are not limited in the forgoing example, and in other embodiments, the spacers 300 may be at least one circle, parallel bars or other types. The embodiment is an illustration of the present invention rather than limiting of the present invention.

Figure 7A:
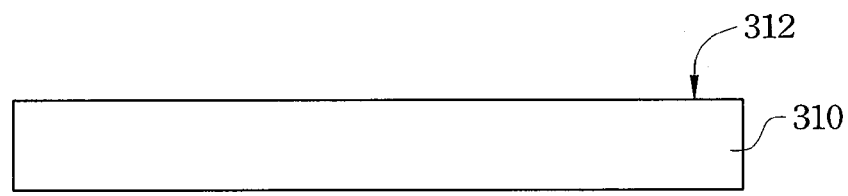
FIGS. 7A through 7D are schematic flow diagrams showing the package process of the chip package illustrated in FIG. 5.

The following description illustrates a process of the chip package using the aforementioned protuberances as the spacers. Refer to FIG. 7A through to FIG. 7D, FIG. 7A through FIG. 7D are schematic flow diagrams showing the package process of the chip package illustrated in FIG. 5.

As shown in FIG. 7A, a package substrate 310 having a carrying surface 312 is initially provided, wherein the package substrate 310 is a multi-layered circuit board, for example.

Figure 7B:
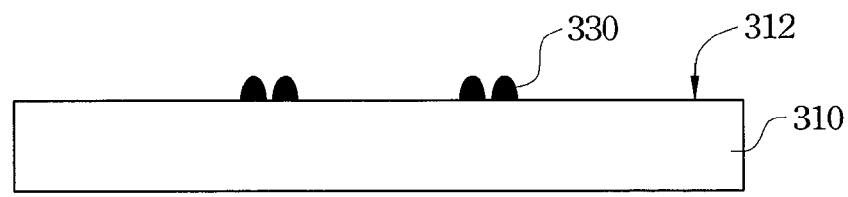

Next, as shown in FIG. 7B, the spacers 330 are formed on the carrying surface 312 of the package substrate 310, wherein the step of forming the spacers 300 is performed by a printing method, or a photolithography and/or etching process. For example, when the printing method is used, a stencil including spacer patterns may be used to form the spacers 330 directly on the carrying surface 312 of the package substrate 310. When the photolithography process is used, a solder mask layer (not shown) of the package substrate 310 is formed, and then a photoresist material is formed on the solder mask layer, wherein the photoresist material and the solder mask layer may have the same material, and the photoresist material is green print. Therefore, after an exposure step and a developing step, the spacers 330 are formed on the package substrate 310. When the material of the spacers 330 is not a photo-sensitive material, a photoresist is additionally formed and an exposure step and a developing step is performed on the photoresist, and then an etching step is performed with the photoresist as the mask to form the spacers 330.

Figure 7C:
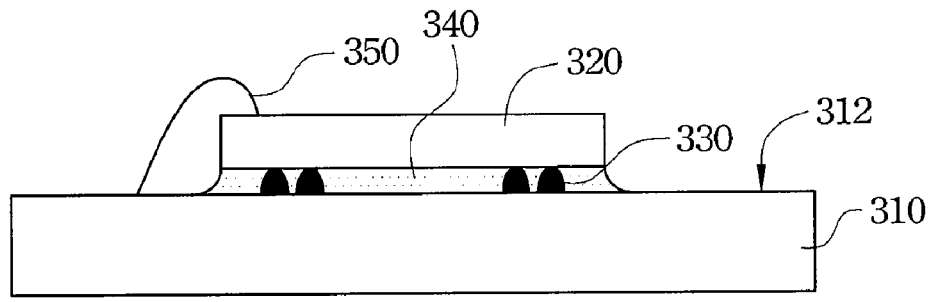

Then, as shown in FIG. 7C, the chip 320 is connected onto the carrying surface 312 of the package substrate 310 by wire bonding, wherein the chip 320 is connected to the package substrate 310 by an adhesive layer 340, the chip 320 is electrically connected to the package substrate 310 by the wires 350, and the spacers 330 are between the chip 320 and the package substrate 310.

Figure 7D:
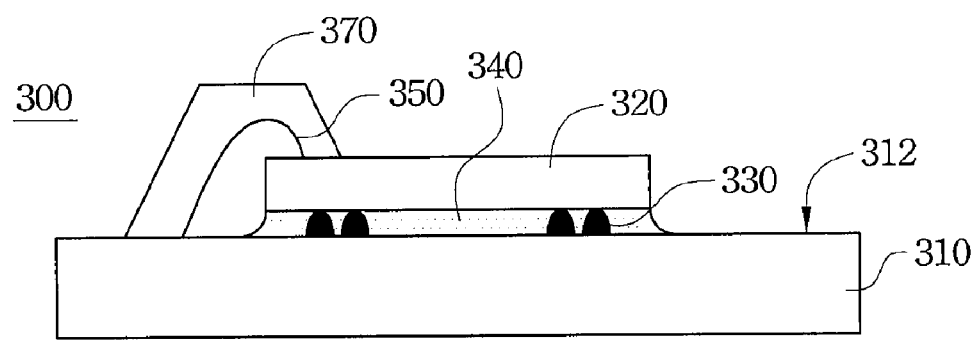

Subsequently, as shown in FIG. 7D, a molding process is performed to form molding glue 370 on the package substrate 310, wherein the molding glue 370 encapsulates the wires 350 and exposes a portion of the chip 320, so as to form the chip package 300.

According to the aforementioned description, in the chip package and the chip package process of the present invention, an interval between the chip and the package substrate is maintained by spacers, so that the present invention can effectively prevent the defects of the prior art. With the supporting of the spacers, the spillage of the adhesive layer between the chip and the package substrate (i.e. the material of the adhesive layer oozes from the periphery of the chip) when the chip is deposed onto the package substrate can be greatly reduced. In addition, the thickness of the adhesive layer between the chip and the package substrate can be controlled easily, and the connection effect of the chip and the package substrate improved. Furthermore, the chip can be deposed on the carrying surface stably, so that the process yield of the chip package process can be effectively enhanced for providing superior product reliability.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A chip package process, comprising:
   providing a package substrate, wherein the package substrate has a carrying surface;
   forming a plurality of indentations in the carrying surface;
   forming a plurality of metal layers respectively in the indentations;
   forming a plurality of spacers on the metal layers in the indentations, wherein each of the spacers is a metal ball; and
   connecting a chip onto the carrying surface of the package substrate by wire bonding, and the spacers are deposed between the chip and the carrying surface.

2. The chip package process according to claim 1, wherein a method for forming the spacers includes a printing method, or a photolithography and/or etching process.

3. The chip package process according to claim 1, further comprising forming a molding glue on the package substrate after wire bonding the chip and the package substrate, wherein the molding glue encapsulates the wires and at least covers a portion of the package substrate and a portion of the chip.

* * * * *